United States Patent
Wang

(10) Patent No.: US 7,145,203 B2
(45) Date of Patent: Dec. 5, 2006

(54) GRADED-JUNCTION HIGH-VOLTAGE MOSFET IN STANDARD LOGIC CMOS

(75) Inventor: Bin Wang, Seattle, WA (US)

(73) Assignee: IMPINJ, Inc., Seattle, WA (US)

( * ) Notice: Subject to any disclaimer, the term of this patent is extended or adjusted under 35 U.S.C. 154(b) by 76 days.

(21) Appl. No.: 10/884,326

(22) Filed: Jul. 2, 2004

(65) Prior Publication Data
US 2005/0236666 A1 Oct. 27, 2005

Related U.S. Application Data

(60) Provisional application No. 60/565,553, filed on Apr. 26, 2004.

(51) Int. Cl.
*H01L 29/78* (2006.01)
(52) U.S. Cl. ............ 257/339; 257/336; 257/343; 257/412
(58) Field of Classification Search ........... 257/335, 257/336, 339, 343, 412
See application file for complete search history.

(56) References Cited

U.S. PATENT DOCUMENTS

| | | | |
|---|---|---|---|
| 5,485,027 A | 1/1996 | Williams et al. | |
| 5,553,030 A | 9/1996 | Tedrow et al. | |
| 6,023,188 A | 2/2000 | Lee et al. | |
| 6,160,290 A * | 12/2000 | Pendharkar et al. | 257/339 |
| 6,177,830 B1 | 1/2001 | Rao | |
| 6,211,552 B1 * | 4/2001 | Efland et al. | 257/343 |
| 6,559,683 B1 | 5/2003 | Kwon et al. | |
| 6,593,621 B1 * | 7/2003 | Tsuchiko et al. | 257/335 |

(Continued)

OTHER PUBLICATIONS

Bassin, et al., "High-Voltage Devices for 0.5-μm Standard CMOS Technology", IEEE Electron Device Letters, vol. 21, No. 1, Jan. 2000, pp. 41-42.

(Continued)

*Primary Examiner*—Gene M. Munson
(74) *Attorney, Agent, or Firm*—Thelen Reid & Priest LLP; David B. Ritchie

(57) ABSTRACT

A high-voltage graded junction LDMOSFET includes a substrate of a first conductivity type, a well of the first conductivity type disposed in the substrate, a first region of a second conductivity type disposed in the well of the first conductivity type, a source terminal coupled to the first region of the second conductivity type, a well of the second conductivity type disposed in the substrate, a second region of the second conductivity type disposed in the well of the second conductivity type, a drain terminal coupled to the second region of the second conductivity type, a region of the first conductivity type disposed in the substrate, a body terminal coupled to the region of the first conductivity type, a graded-junction region formed of material of the first conductivity type separating the well of the first conductivity type and the well of the second conductivity type, the material of the first conductivity type in the graded-junction region doped at least an order of magnitude less than the wells, a dielectric layer disposed over the well of the first conductivity type, the graded-junction region and a portion of the well of the second conductivity type, a first isolator disposed in the well of the second conductivity type, the isolator including a dielectric material that is in contact with the dielectric layer, a second isolator disposed at least partially in the well of the second conductivity type, the second isolator including a dielectric material and isolating the second region of the second conductivity type from the region of the first conductivity type, and a gate disposed over the dielectric layer and a portion of the first isolator.

80 Claims, 3 Drawing Sheets

U.S. PATENT DOCUMENTS

| | | |
|---|---|---|
| 6,661,278 B1 | 12/2003 | Gilliland |
| 6,734,493 B1 * | 5/2004 | Chen et al. .................. 257/328 |
| 6,831,331 B1 | 12/2004 | Kitamura et al. |
| 6,873,021 B1 | 3/2005 | Mitros et al. |
| 6,882,023 B1 * | 4/2005 | Khemka et al. ............ 257/493 |

OTHER PUBLICATIONS

Declercq, et al., "Design and Optimization of High-Voltage CMOS Devices Compatible with a Standard 5 V CMOS Technology", IEEE Custom Integrated Circuits Conference, 1993, pp. 24.6.1-24.6.4.

Dickson, "On-Chip High-Voltage Generation in MNOS Integrated Circuits Using an, Improved Voltage Multiplier Technique", IEEE Journal of Solid-State Circuits, vol. SC-11, No. 3, Jun. 1976, pp. 374-378.

Favrat, et al., "A High-Efficiency CMOS Voltage Doubler", IEEE Journal of Solid-State Circuits, vol. 33, No. 3, Mar. 1998, pp. 410-416.

Witters, et al., "Analysis and Modeling of On-Chip High-Voltage Generator Circuits for Use in EEPROM Circuits", IEEE Journal of Solid-State Circuits, vol. 24, No. 5, Oct. 1989, pp. 1372-1380.

Vishnu Khemka et al., "A Floating RESURF (FRESURF) LD-MOSFET Device Concept", IEEE Electron Device Letters, vol. 24, No. 10, Oct. 2003, pp. 664-666.

* cited by examiner

GRADED-JUNCTION HIGH-VOLTAGE MOSFET IN STANDARD LOGIC CMOS

RELATED APPLICATIONS

This application claims the benefit of U.S. Provisional Patent Application Ser. No. 60/565,553 filed Apr. 26, 2004 in the name of the same inventor and commonly assigned herewith. This application may also be considered related to U.S. patent application Ser. No. 10/884,236 filed on Jul. 2, 2004, entitled "Native High-Voltage N-Channel LDMOS-FET in Standard Logic CMOS" in the name of the same inventor and commonly assigned herewith.

FIELD OF THE INVENTION

The present invention relates generally to high-voltage transistors. More particularly, the present invention relates to a graded-junction high-voltage MOSFET (metal oxide semiconductor field effect transistor) fabricated in a standard logic CMOS (complementary MOS) process.

BACKGROUND OF THE INVENTION

LDMOSFETs (laterally diffused MOSFETs) are known. Such devices are used as high-voltage switches and components in devices fabricated in various MOS process (fabrication) technologies including logic CMOS and the like but having relatively high-voltage requirements (e.g., 10 volts in a 3.3 volt process). Such high-voltages are used in charge pumps, programming nonvolatile memory circuits, on-chip LCD (liquid crystal display) display drivers, on-chip field-emission display drivers, and the like. A typical LDMOSFET 10 (also referred to as an LDMOS) is shown in elevational cross-section in FIG. 1. LDMOS 10 is fabricated in a p– substrate 12. A first n+ doped region 13 is disposed in first p– well 14 of substrate 12. A source terminal 16 is coupled to first n+ doped region 13. A p+ doped region 18 is disposed in second p– well 15. A body terminal 20 is coupled to p+ doped region 18. An n– well 22 is disposed in p– substrate 12 between first p– well 14 and second p– well 15. A first isolation structure 23 such as first trench 24 is disposed in n– well 22. An isolation structure 23 such as first trench 24 is filled with an insulating dielectric material such as silicon dioxide which may be deposited or grown in any convenient manner such as using the well-known Shallow Trench Isolation (STI) process (as shown) or the well-known Local Oxidation of Silicon (LOCOS) process (not shown). A second n+ region 28 is disposed in n– well 22. A drain terminal 30 is coupled to said second n+ region 28. Second isolation structure 25 such as trench 26 is disposed at least partially in n– well 22 and acts to isolate second n+ region 28 from p+ region 18. A layer of dielectric 33 is disposed over a portion of first p– well 14, the p– well/n– well junction region 34, a portion of n– well 22 and a portion of first trench 24 as illustrated. A gate region 32 is in contact with the dielectric layer 33 as well as the dielectric material in first trench 24. Gate region 32 may comprise n+ doped polysilicon material, p+ doped polysilicon material, metal, or any other suitable material used for forming a conductive gate. Insulating end caps 36 and 38 are also provided. The region denoted Lc is the channel of the device extending from the source region 14 to the first isolation structure 23, as shown, and Lc denotes its length. The region denoted Lw is a region of lateral diffusion under the gate and Lw denotes its length. The region denoted Lo is a region extending from one end of the channel to the end of the gate (where the gate extends over the first isolation structure 23), as shown, and Lo denotes its length. The region denoted Ldp is coextensive with the first isolation structure 23 and Ldp denotes its length. It provides gate isolation.

In this device the n– well is used as the drain of the device. A high breakdown voltage is provided due to lateral diffusion in the region denoted Lw under the gate. This results in deep junctions with lower doping than a typical n+ drain implant. The breakdown voltage is determined by the doping concentration of the n-well (approximately $10^{17}/cm^3$) and p-well (approximately $10^{17}/cm^3$) of the n-well/p-well junction. The prior art embodiment shown uses shallow trench isolation (STI). Similar embodiments implementing a LOCOS isolation scheme are also well known in the art.

As device geometries and minimum feature sizes (MFS) shrink, e.g., from 0.18 micron MFS to 0.13 micron MFS to 0.09 micron MFS and beyond, new ways to provide relatively high breakdown voltages, particularly in logic CMOS processes, become more and more important. Logic CMOS is important because it is commonly available at low cost with minimum process steps. Accordingly, it would be highly desirable to provide an improved high-voltage switching device.

SUMMARY OF THE INVENTION

In a first aspect of the present invention, a high-voltage graded junction LDMOSFET includes a p– doped substrate, a p– well disposed in the substrate, a first n+ doped region disposed in the p– well, a source terminal coupled to the first n+ doped region, an n– well disposed in the substrate, a second n+ doped region disposed in the n– well, a drain terminal coupled to the second n+ doped region, a p+ doped region disposed in the substrate, a body terminal coupled to the p+ doped region, a graded-junction region formed of p– doped material separating the p– well and the n– well, the p– doped material in the graded-junction region doped at least an order of magnitude less than the p– well and the n– well, a dielectric layer disposed over the p– well, the graded-junction region and a portion of the n– well, a first isolator disposed in the n– well, the isolator including a dielectric material that is in contact with the dielectric layer, a second isolator disposed at least partially in the n– well, the second isolator including a dielectric material and isolating the second n+ region from the p+ region, and a gate disposed over the dielectric layer and a portion of the first isolator.

In a second aspect of the invention the above-described invention may be implemented as a high-voltage graded junction LDMOSFET having an n– doped substrate, an n– well disposed in the substrate, a first p+ doped region disposed in the n– well, a source terminal coupled to the first p+ doped region, a p– well disposed in the substrate, a second p+ doped region disposed in the p– well, a drain terminal coupled to the second p+ doped region, an n+ doped region disposed in the substrate, a body terminal coupled to the n+ doped region, a graded-junction region formed of n– doped material separating the n– well and the p– well, the n– doped material in the graded-junction region doped at least an order of magnitude less than the n– well and the p– well, a dielectric layer disposed over the n– well, the graded-junction region and a portion of the p– well, a first isolator disposed in the p– well, the isolator including a dielectric material that is in contact with the dielectric layer, a second isolator disposed at least partially in the p– well, the second isolator including a dielectric material and isolating the second p+ region from the n+ region, and a gate disposed over the dielectric layer and a portion of the first isolator.

The graded-junction region may be part of the substrate or it may be a grown, deposited or implanted region doped at approximately the level of the substrate. STI, LOCOS and other suitable processes may be used for forming the isolators.

Other aspects of the inventions are described and claimed below, and a further understanding of the nature and advantages of the inventions may be realized by reference to the remaining portions of the specification and the attached drawings.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention described in the following detailed description are directed at high-voltage n-channel MOSFET devices. Those of ordinary skill in the art will realize that the detailed description is illustrative only and is not intended to restrict the scope of the claimed inventions in any way. Other embodiments of the present invention, beyond those embodiments described in the detailed description, will readily suggest themselves to those of ordinary skill in the art having the benefit of this disclosure. Reference will now be made in detail to implementations of the present invention as illustrated in the accompanying drawings. Where appropriate, the same reference indicators will be used throughout the drawings and the following detailed description to refer to the same or similar parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n-doped semiconductor material typically having a doping level of n-type dopants on the order of $10^{20}$ atoms per cubic centimeter. The symbol n− indicates an n-doped semiconductor material typically having a doping level on the order of $10^{17}$ atoms per cubic centimeter for n-doped wells and on the order of $10^{15}$ atoms per cubic centimeter for n-substrate material. The symbol p− indicates a p− doped semiconductor material typically having a doping level of p-type dopants on the order of $10^{20}$ atoms per cubic centimeter. The symbol p− indicates a p-doped semiconductor material typically having a doping level on the order of $10^{17}$ atoms per cubic centimeter for p− doped wells and on the order of $10^{15}$ atoms per cubic centimeter for p− substrate material. Those of ordinary skill in the art will now also realize that a range of doping concentrations around those described above will also work. Essentially, any process capable of forming pFETs and nFETs will work. Doped regions may be diffusions or they may be implanted. When it is said that something is doped at approximately the same level as something else, the doping levels are within a factor of ten of each other, e.g., $10^{16}$ is within a factor often of $10^{15}$ and $10^{17}$.

Figure 2:
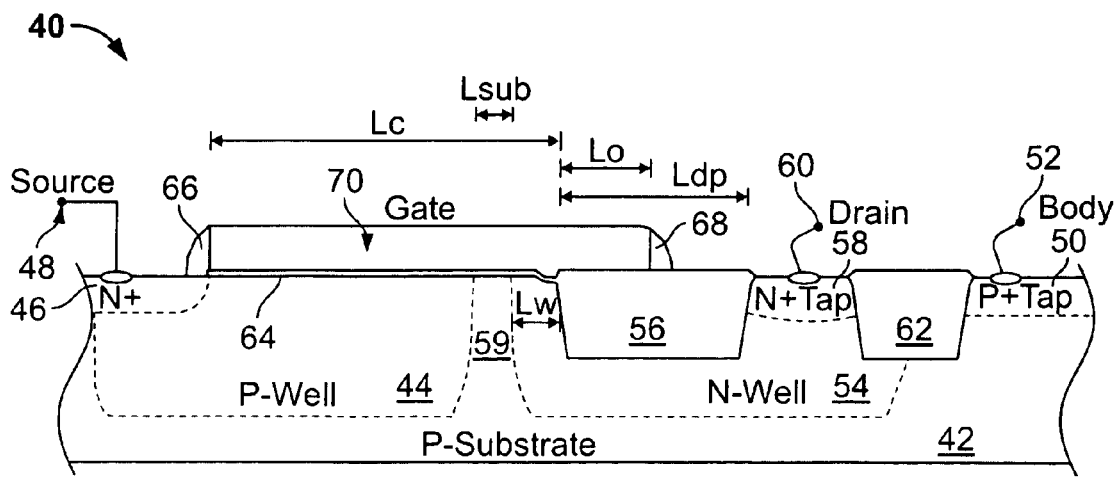
FIG. 2 is an elevational cross-sectional diagram of a graded-junction high-voltage n-channel MOSFET in accordance with an embodiment of the present invention.

Turning now to FIG. 2, FIG. 2 is an elevational cross-sectional diagram of a graded-junction high-voltage n-channel MOSFET 40 in accordance with an embodiment of the present invention. Graded-junction MOSFET 40 is formed on a p− substrate 42. A first p− well 44 is formed in substrate 42. A first n+ doped region 46 is disposed in p− well 44. A source terminal 48 is coupled to first n+ doped region 46. A p+ doped region 50 is disposed in substrate 42. A body terminal 52 is coupled to p+ doped region 50. An n− well 54 is also disposed in substrate 42. A first isolator 56 such as a trench is disposed in n− well 54. First isolator 56 comprises a dielectric material such as silicon dioxide which may be deposited or grown in any convenient manner such as by using the STI or LOCOS process. A second n+ region 58 is disposed in n− well 54. A drain terminal 60 is coupled to said second n+ region 58. Second isolator 62 such as a trench is disposed at least partially in n− well 54 and acts to isolate second n+ region 58 from p+ region 50. Isolator 62 comprises a dielectric material like first isolator 56. A graded-junction region 59 exists between first p− well 44 and n− well 54. The graded-junction region 59 may be substrate (doped about 2 orders of magnitude less than the n− well 54 and p− well 44) or it may be a deposited, implanted or grown region doped at least an order of magnitude less than p− well 44 and n− well 54. A layer of dielectric 64 is disposed over a portion of p− well 44, the graded-junction region 59 and a portion of first isolator 56 as illustrated. A gate region 70 is in contact with the dielectric material layer 64 and the dielectric material of first isolator 56. Gate region 70 may comprise n+ doped polysilicon material, p+ doped polysilicon material, metal, or any other suitable material used for forming a conductive gate. Insulating end caps 66 and 68 are also provided as is well-known to those of ordinary skill in the art.

The region denoted Lc is the channel of the device extending from the source region 46 to the first isolator 56, as shown, and Lc denotes its length. The region denoted Lw is a region of lateral diffusion under the gate and Lw denotes its length. The region denoted Lo is a region extending from one end of the channel to the end of the gate (where the gate extends over the first isolator 56), as shown, and Lo denotes its length. The region denoted Ldp is a region coextensive with the first isolator 56 extending to the near edge of n+ region 58 (as shown) and Ldp denotes its length. It provides gate isolation. The region denoted Lsub is the graded-junction of the device and extends between the Lw region and the p– well 44. Lsub denotes its length.

By blocking the higher-doped p– well implants (with photo resist or another material) in the dimension labeled Lsub, a graded junction results. The breakdown voltage of the n– well ($10^{17}/cm^3$)/p– substrate ($10^{15}/cm^3$) junction is much higher than that of the n– well($10^7/cm^3$)/p– well ($10^{17}/cm^3$) junction. In some process technologies a p– well blocking layer is available and can be used as an alternative to substrate in the graded-junction region. The length of the Lsub region may be adjusted to control the breakdown voltage of the device.

The present invention may be easily implemented in many standard MOS processes, such as, for example, p– well, n– well, twin-tub (n– and p– wells), and the like. It provides less damage to dielectric layer under gate region and the increased breakdown voltages on the order of 25%.

Figure 1:
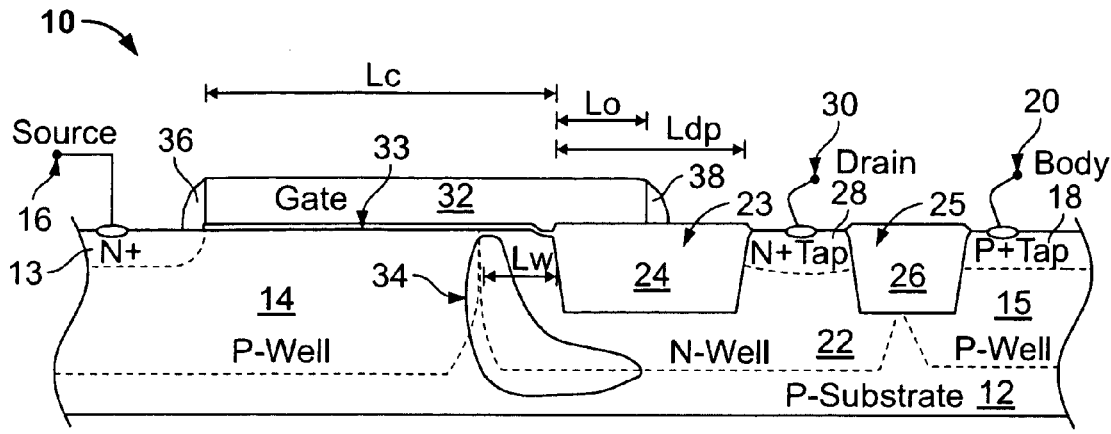
FIG. 1 is an elevational cross-sectional diagram of a lateral diffusion n-channel MOSFET in accordance with the prior art.
Figure 3:
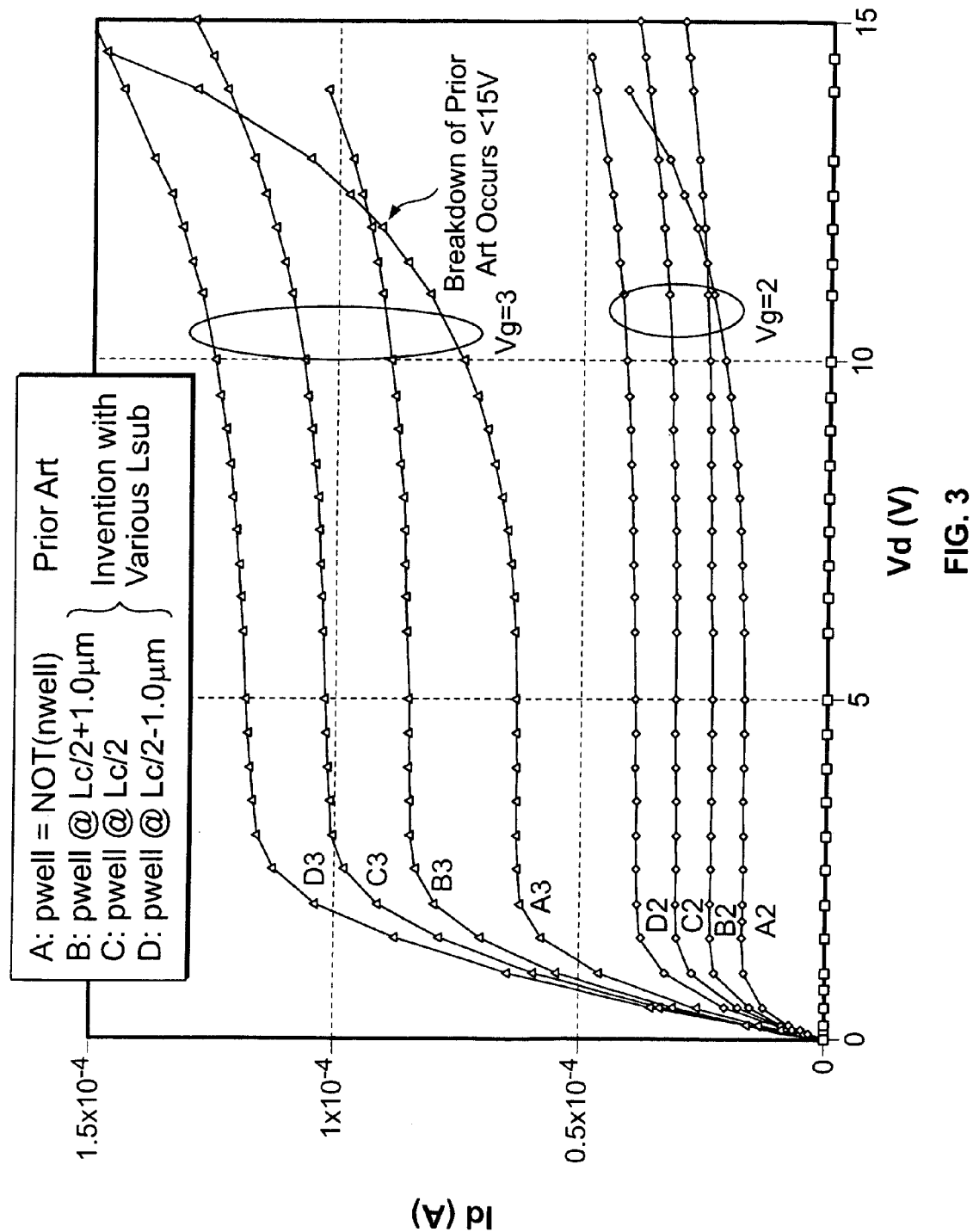
FIG. 3 is a plot of Id-Vds (Drain Current—Drain-Source Voltage) curves for a graded-junction high-voltage n-channel MOSFET in accordance with an embodiment of the present invention under various conditions.

FIG. 3 is a plot of Id-Vds (Drain Current—Drain-Source Voltage) curves for a graded-junction high-voltage n-channel MOSFET in accordance with an embodiment of the present invention under various conditions. In FIG. 3 there are eight data sets plotted. These are grouped into two main sets, those with a gate voltage of 2V (the lower set of four denoted A2, B2, C2 and D2) and those with a gate voltage of 3V (the upper set of four denoted A3, B3, C3 and D3). Curves A2 and A3 show the results where Lsub=0 and the n– well and the p– well form a junction directly as in FIG. 1. Curves B2 and B3 represent a graded-junction device with Lsub=Lc/2+1.0 microns; curves C2 and C3 represent a graded-junction device with Lsub=Lc/2; and curves D2 and D3 represent a graded-junction device with Lsub=Lc/2–1.0 microns. The up-turns of the A2 and A3 curves prior to 15V of drain-source voltage represent breakdown of the device. The other curves show no breakdown prior to 15V. Note that these are computer simulated results.

Table 1 below lists typical dimensions for a graded-junction LDMOSFET in accordance with an embodiment of the present invention implemented in a conventional logic CMOS process with STI and LOCOS isolation. Dimensions are given in microns. LOCOS is typically used in processes with a minimum feature size (MFS) of 0.35 micron and above (0.35 micron is the example used in the table); STI is typically used in processes with an MFS of 0.25 microns and below (0.25 micron is the example used in the table).

TABLE 1

| Isolation | Lw | Lsub | Lc | Ldp | Lo |
|---|---|---|---|---|---|
| STI | >=0.0 | >=0.4 | >=0.7 | >=0.8 | >=0.4 |
| LOCOS | >=0.2 | >=0.4 | >=0.7 | >=0.8 | >=0.4 |

Figure 4:
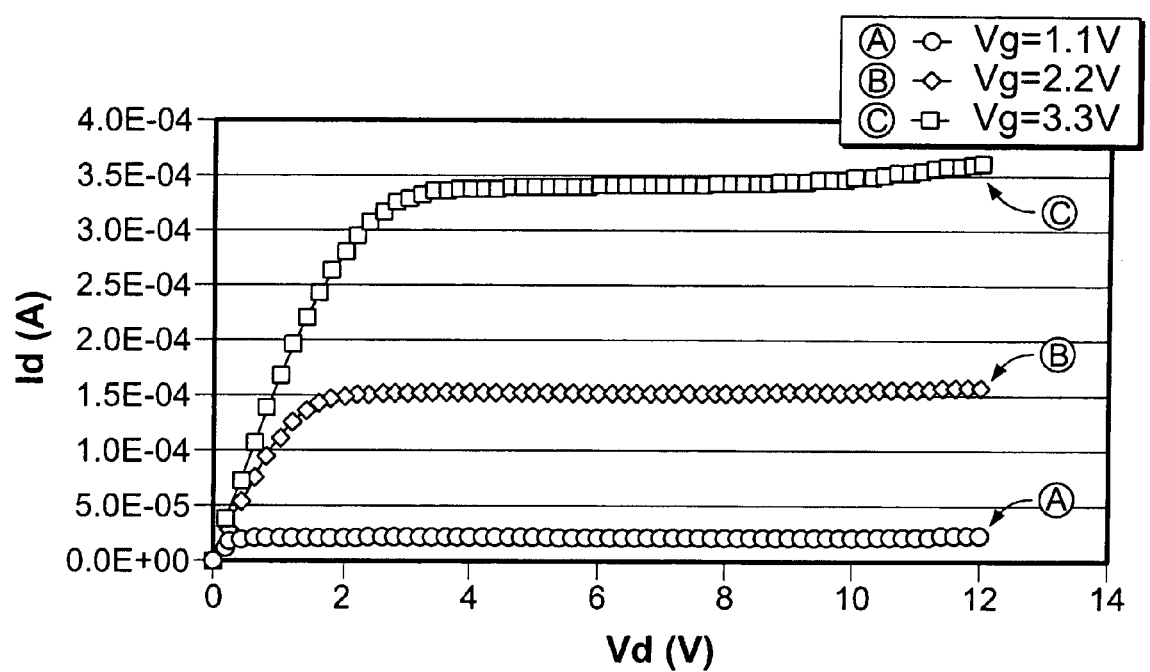
FIG. 4 is a plot of actual data showing the performance of a high-voltage graded-junction NMOSFET in accordance with an embodiment of the present invention.

FIG. 4 is a plot of actual data showing the performance (drain current vs. drain voltage for various gate voltages) of a high-voltage graded-junction LDMOSFET in accordance with an embodiment of the present invention. The data is derived from an actual device fabricated with STI isolation, in a 0.25 micron MFS logic CMOS process fabrication technology with Lw=0.2 um, Lsub=1.6 um, Lc=1.7 um, Ldp=1.4 um, Lo=0.3 um (where um=micron). As can be seen in FIG. 4, the device did not experience voltage breakdown at up to and exceeding Vd=12 volts for gate voltages Vg=1.1V (Dataset "A"), Vg=2.2V (Dataset "B") and Vg=3.3V (Dataset "C").

Those of ordinary skill in the art will now realize that the conductivity types (n for p and p for n) may be exchanged and the device built on an n– substrate as a pFET (p-channel MOSFET) and such versions are intended to be encompassed herein and by the appended claims.

While embodiments and applications of this invention have been shown and described, it will now be apparent to those skilled in the art having the benefit of this disclosure that many more modifications than mentioned above are possible without departing from the inventive concepts disclosed herein. Therefore, the appended claims are intended to encompass within their scope all such modifications as are within the true spirit and scope of this invention.

What is claimed is:

1. A high-voltage n-channel MOSFET, comprising:
   a p– doped substrate;
   a p– well disposed in said substrate;
   a first n+ doped region disposed in said p– well;
   a source terminal coupled to said first n+ doped region;
   an n– well disposed in said substrate;
   a second n+ doped region disposed in said n– well;
   a drain terminal coupled to said second n+ doped region;
   a p+ doped region disposed in said substrate;
   a body terminal coupled to said p+ doped region;
   a graded-junction region of said substrate separating said p– well and said n– well;
   a dielectric layer disposed over said p– well, said graded junction region and a portion of said n– well;
   a first isolator disposed in said n– well, said isolator including a dielectric material that is in contact with said dielectric layer;
   a second isolator disposed at least partially in said n– well, said second isolator including a dielectric material and isolating said second n+ region from said p+ region; and
   a gate disposed over said dielectric layer and a portion of said first isolator.

2. The high-voltage n-channel MOSFET of claim 1, wherein said gate comprises n+ doped polysilicon.

3. The high-voltage n-channel MOSFET of claim 1, wherein said gate comprises p+ doped polysilicon.

4. The high-voltage n-channel MOSFET of claim 1, wherein said gate comprises metal.

5. The high-voltage n-channel MOSFET of claim 1, wherein said dielectric material is silicon dioxide.

6. The high-voltage n-channel MOSFET of claim 1, wherein said isolators are formed with an STI process.

7. The high-voltage n-channel MOSFET of claim 1, wherein said isolators are formed with a LOCOS process.

8. The high-voltage n-channel MOSFET of claim 1, wherein:
   the MOSFET is fabricated using a process technology providing an MFS of no greater than 0.18 microns.

9. The high-voltage n-channel MOSFET of claim 8, wherein:
   the isolators are fabricated using STI.

10. The high-voltage n-channel MOSFET of claim 9, wherein:
   a length Lw of a region of lateral diffusion under the gate being greater than or equal to 0.0 microns;
   a length Lsub of the graded junction region being greater than or equal to 0.4 microns;
   a length Lc of a channel region extending between the first n+ doped region and the first isolator being greater than or equal to 0.7 microns;
   a length Ldp of a region coextensive with the first isolator and extending to an edge of the second n+ doped region being greater than or equal to 0.8 microns; and a length Lo of a region extending from one end of the channel to the end of the gate being greater than or equal to 0.4 microns.

11. The high-voltage n-channel MOSFET of claim 8, wherein:
the isolators are fabricated using LOCOS.

12. The high-voltage n-channel MOSFET of claim 11, wherein:
a length Lw of a region of lateral diffusion under the gate being greater than or equal to 0.2 microns;
a length Lsub of the graded junction region being greater than or equal to 0.4 microns;
a length Lc of a channel region extending between the first n+ doped region and the first isolator being greater than or equal to 0.7 microns;
a length Ldp of a region coextensive with the first isolator and extending to an edge of the second n+ doped region being than or equal to 0.8 microns; and
a length Lo of a region extending from one end of the channel to the end of the gate being greater than or equal to 0.4 microns.

13. The high-voltage n-channel MOSFET of claim 1, wherein said graded-junction region comprises substrate material.

14. The high-voltage n-channel MOSFET of claim 1, wherein said graded-junction region is achieved by using a p− well blocking layer during fabrication.

15. A high-voltage n-channel MOSFET, comprising:
a p− doped substrate;
a p− well disposed in said substrate;
a first n+ doped region disposed in said p− well;
a source terminal coupled to said first n+ doped region;
an n− well disposed in said substrate;
a second n+ doped region disposed in said n− well;
a drain terminal coupled to said second n+ doped region;
a p+ doped region disposed in said substrate;
a body terminal coupled to said p+ doped region;
a graded-junction region formed of p− doped material separating said p− well and said n− well, said p− doped material in said graded junction region doped at approximately the same level as said substrate;
a dielectric layer disposed over said p− well, said graded-junction region and a portion of said n− well;
a first isolator disposed in said n− well, said isolator including a dielectric material that is in contact with said dielectric layer;
a second isolator disposed at least partially in said n− well, said second isolator including a dielectric material and isolating said second n+ region from said p+ region; and
a gate disposed over said dielectric layer and a portion of said first isolator.

16. The high-voltage n-channel MOSFET of claim 15, wherein said gate comprises n+ doped polysilicon.

17. The high-voltage n-channel MOSFET of claim 15, wherein said gate comprises p+ doped polysilicon.

18. The high-voltage n-channel MOSFET of claim 15, wherein said gate comprises metal.

19. The high-voltage n-channel MOSFET of claim 15, wherein said dielectric material is silicon dioxide.

20. The high-voltage n-channel MOSFET of claim 15, wherein said isolators are formed with an STI process.

21. The high-voltage n-channel MOSFET of claim 15, wherein said isolators are formed with a LOCOS process.

22. The high-voltage n-channel MOSFET of claim 15, wherein:
the MOSFET is fabricated using a process technology providing an MFS of no greater than 0.18 microns.

23. The high-voltage n-channel MOSFET of claim 22, wherein:
the isolators are fabricated using STI.

24. The high-voltage n-channel MOSFET of claim 23, wherein:
a length Lw of a region of lateral diffusion under the gate being greater than or equal to 0.0 microns;
a length Lsub of the graded junction region being greater than or equal to 0.4 microns;
a length Lc of a channel region extending between the first n+ doped region and the first isolator being greater than or equal to 0.7 microns;
a length Ldp of a region coextensive with the first isolator and extending to an edge of the second n+ doped region being greater than or equal to 0.8 microns; and
a length Lo of a region extending from one end of the channel to the end of the gate being greater than or equal to 0.4 microns.

25. The high-voltage n-channel MOSFET of claim 22, wherein:
the isolators are fabricated using LOCOS.

26. The high-voltage n-channel MOSFET of claim 25, wherein:
a length Lw of a region of lateral diffusion under the gate being greater than or equal to 0.2 microns;
a length Lsub of the graded junction region being greater than or equal to 0.4 microns;
a length Lc of a channel region extending between the first n+ doped region and the first isolator being greater than or equal to 0.7 microns;
a length Ldp of a region coextensive with the first isolator and extending to an edge of the second n+ doped region being greater than or equal to 0.8 microns; and
a length Lo of a region extending from one end of the channel to the end of the gate being greater than or equal to 0.4 microns.

27. A high-voltage n-channel MOSFET, comprising:
a p− doped substrate;
a p− well disposed in said substrate;
a first n+ doped region disposed in said p− well;
a source terminal coupled to said first n+ doped region;
an n− well disposed in said substrate;
a second n+ doped region disposed in said n− well;
a drain terminal coupled to said second n+ doped region;
a p+ doped region disposed in said substrate;
a body terminal coupled to said p+ doped region;
a graded-junction region formed of p− doped material separating said p− well and said n− well, said p− doped material in said graded-junction region doped at least an order of magnitude less than said p− well and said n− well;
a dielectric layer disposed over said p− well, said graded-junction region and a portion of said n− well;
a first isolator disposed in said n− well, said first isolator including a dielectric material that is in contact with said dielectric layer;
a second isolator disposed at least partially in said n− well, said isolator including a dielectric material and isolating said second n+ region from said p+ region; and
a gate disposed over said dielectric layer and a portion of said first isolator.

28. The high-voltage n-channel MOSFET of claim 27, wherein said gate comprises n+ doped polysilicon.

29. The high-voltage n-channel MOSFET of claim 27, wherein said gate comprises p+ doped polysilicon.

30. The high-voltage n-channel MOSFET of claim 27, wherein said gate comprises metal.

31. The high-voltage n-channel MOSFET of claim 27, wherein said dielectric material is silicon dioxide.

32. The high-voltage n-channel MOSFET of claim 27, wherein said isolators are formed with an STI process.

33. The high-voltage n-channel MOSFET of claim 27, wherein said isolators are formed with a LOCOS process.

34. The high-voltage n-channel MOSFET of claim 27, wherein:
the MOSFET is fabricated using a process technology providing an MFS of no greater than 0.18 microns.

35. The high-voltage n-channel MOSFET of claim 34, wherein:
the isolators are fabricated using STI.

36. The high-voltage n-channel MOSFET of claim 35, wherein:
a length Lw of a region of lateral diffusion under the gate being greater than or equal to 0.0 microns;
a length Lsub of the graded junction region being greater than or equal to 0.4 microns;
a length Lc of a channel region extending between the first n+ doped region and the first isolator being greater than or equal to 0.7 microns;
a length Ldp of a region coextensive with the first isolator and extending to an edge of the second n+ doped region being greater than or equal to 0.8 microns; and
a length Lo of a region extending from one end of the channel to the end of the gate being is greater than or equal to 0.4 microns.

37. The high-voltage n-channel MOSFET of claim 34, wherein:
the isolators are fabricated using LOCOS.

38. The high-voltage n-channel MOSFET of claim 37, wherein:
a length Lw of a region of lateral diffusion under the gate being greater than or equal to 0.2 microns;
a length Lsub of the graded junction region being greater than or equal to 0.4 microns;
a length Lc of a channel region extending between the first n+ doped region and the first isolator being greater than or equal to 0.7 microns;
a length Ldp of a region coextensive with the first isolator and extending to an edge of the second n+ doped region being greater than or equal to 0.8 microns; and
a length Lo of a region extending from one end of the channel to the end of the gate being greater than or equal to 0.4 microns.

39. The high-voltage n-channel MOSFET of claim 27, wherein said graded-junction region comprises substrate material.

40. The high-voltage n-channel MOSFET of claim 27, wherein said graded-junction region is achieved by using a p− well blocking layer during fabrication.

41. A high-voltage p-channel MOSFET, comprising:
an n− doped substrate;
an n− well disposed in said substrate;
a first p+ doped region disposed in said n− well;
a source terminal coupled to said first p+ doped region;
a p− well disposed in said substrate;
a second p+ doped region disposed in said p− well;
a drain terminal coupled to said second p+ doped region;
an n+ doped region disposed in said substrate;
a body terminal coupled to said n+ doped region;
a graded-junction region of said substrate separating said n− well and said p− well;
a dielectric layer disposed over said n− well, said graded junction region and a portion of said p− well;
a first isolator disposed in said p− well, said isolator including a dielectric material that is in contact with said dielectric layer;
a second isolator disposed at least partially in said p− well, said second isolator including a dielectric material and isolating said second p+ region from said n+ region; and
a gate disposed over said dielectric layer and a portion of said first isolator.

42. The high-voltage p-channel MOSFET of claim 41, wherein said gate comprises p+ doped polysilicon.

43. The high-voltage p-channel MOSFET of claim 41, wherein said gate comprises n+ doped polysilicon.

44. The high-voltage p-channel MOSFET of claim 41, wherein said gate comprises metal.

45. The high-voltage p-channel MOSFET of claim 41, wherein said dielectric material is silicon dioxide.

46. The high-voltage p-channel MOSFET of claim 41, wherein said isolators are formed with an STI process.

47. The high-voltage p-channel MOSFET of claim 41, wherein said isolators are formed with a LOCOS process.

48. The high-voltage p-channel MOSFET of claim 41, wherein:
the MOSFET is fabricated using a process technology providing an MFS of no greater than 0.18 microns.

49. The high-voltage p-channel MOSFET of claim 48, wherein:
the isolators are fabricated using STI.

50. The high-voltage p-channel MOSFET of claim 49, wherein:
a length Lw of a region of lateral diffusion under the gate being greater than or equal to 0.0 microns;
a length Lsub of the graded junction region being greater than or equal to 0.4 microns;
a length Lc of a channel region extending between the first p+ doped region and the first isolator being greater than or equal to 0.7 microns;
a length Ldp of a region coextensive with the first isolator and extending to an edge of the second p+ doped region being greater than or equal to 0.8 microns; and
a length Lo of a region extending from one end of the channel to the end of the gate being greater than or equal to 0.4 microns.

51. The high-voltage p-channel MOSFET of claim 48, wherein:
the isolators are fabricated using LOCOS.

52. The high-voltage p-channel MOSFET of claim 51, wherein:
a length Lw of a region of lateral diffusion under the gate being greater than or equal to 0.2 microns;
a length Lsub of the graded junction region being greater than or equal to 0.4 microns;
a length Lc of a channel region extending between the first p+ doped region and the first isolator being greater than or equal to 0.7 microns;
a length Ldp of a region coextensive with the first isolator and extending to an edge of the second p+ doped region being greater than or equal to 0.8 microns; and
a length Lo of a region extending from one end of the channel to the end of the gate being greater than or equal to 0.4 microns.

53. The high-voltage p-channel MOSFET of claim 41, wherein said graded-junction region comprises substrate material.

54. The high-voltage p-channel MOSFET of claim 41, wherein said graded-junction region is achieved by using a n− well blocking layer during fabrication.

55. A high-voltage p-channel MOSFET, comprising:
   an n− doped substrate;
   an n− well disposed in said substrate;
   a first p+ doped region disposed in said n− well;
   a source terminal coupled to said first p+ doped region;
   a p− well disposed in said substrate;
   a second p+ doped region disposed in said p− well;
   a drain terminal coupled to said second p+ doped region;
   an n+ doped region disposed in said substrate;
   a body terminal coupled to said n+ doped region;
   a graded-junction region formed of n− doped material separating said n− well and said p− well, said n− doped material in said graded junction region doped at approximately the same level as said substrate;
   a dielectric layer disposed over said n− well, said graded-junction region and a portion of said p− well;
   a first isolator disposed in said p− well, said isolator including a dielectric material that is in contact with said dielectric layer;
   a second isolator disposed at least partially in said n− well, said second isolator including a dielectric material and isolating said second p+ region from said n+ region; and
   a gate disposed over said dielectric layer and a portion of said first isolator.

56. The high-voltage p-channel MOSFET of claim 55, wherein said gate comprises p+ doped polysilicon.

57. The high-voltage p-channel MOSFET of claim 55, wherein said gate comprises n+ doped polysilicon.

58. The high-voltage p-channel MOSFET of claim 55, wherein said gate comprises metal.

59. The high-voltage p-channel MOSFET of claim 55, wherein said dielectric material is silicon dioxide.

60. The high-voltage p-channel MOSFET of claim 55, wherein said isolators are formed with an STI process.

61. The high-voltage p-channel MOSFET of claim 55, wherein said isolators are formed with a LOCOS process.

62. The high-voltage p-channel MOSFET of claim 55, wherein:
   the MOSFET is fabricated using a process technology providing an MFS of no greater than 0.18 microns.

63. The high-voltage p-channel MOSFET of claim 62, wherein:
   the isolators are fabricated using STI.

64. The high-voltage p-channel MOSFET of claim 63, wherein:
   a length Lw of a region of lateral diffusion under the gate being greater than or equal to 0.0 microns;
   a length Lsub of the graded junction region being greater than or equal to 0.4 microns;
   a length Lc of a channel region extending between the first p+ doped region and the first isolator being is greater than or equal to 0.7 microns;
   a length Ldp of a region coextensive with the first isolator and extending to an edge of the second p+ doped region being greater than or equal to 0.8 microns; and
   a length Lo of a region extending from one end of the channel to the end of the gate being greater than or equal to 0.4 microns.

65. The high-voltage p-channel MOSFET of claim 62, wherein:
   the isolators are fabricated using LOCOS.

66. The high-voltage p-channel MOSFET of claim 65, wherein:
   a length Lw of a region of lateral diffusion under the gate being greater than or equal to 0.2 microns;
   a length Lsub of the graded junction region being greater than or equal to 0.4 microns;
   a length Lc of a channel region extending between the first p+ doped region and the first isolator being greater than or equal to 0.7 microns;
   a length Ldp of a region coextensive with the first isolator and extending to an edge of the second p+ doped region being greater than or equal to 0.8 microns; and
   a length Lo of a region extending from one end of the channel to the end of the gate being is greater than or equal to 0.4 microns.

67. A high-voltage p-channel MOSFET, comprising:
   an n− doped substrate;
   an n− well disposed in said substrate;
   a first p+ doped region disposed in said n− well;
   a source terminal coupled to said first p+ doped region;
   a p− well disposed in said substrate;
   a second p+ doped region disposed in said p− well;
   a drain terminal coupled to said second p+ doped region;
   an n+ doped region disposed in said substrate;
   a body terminal coupled to said n+ doped region;
   a graded-junction region formed of n− doped material separating said n− well and said p− well, said n− doped material in said graded-junction region doped at least an order of magnitude less than said n− well and said p− well;
   a dielectric layer disposed over said n− well, said graded-junction region and a portion of said p− well;
   a first isolator disposed in said p− well, said first isolator including a dielectric material that is in contact with said dielectric layer;
   a second isolator disposed at least partially in said p− well, said isolator including a dielectric material and isolating said second p region from said n+ region; and
   a gate disposed over said dielectric layer and a portion of said first isolator.

68. The high-voltage p-channel MOSFET of claim 67, wherein said gate comprises p+ doped polysilicon.

69. The high-voltage p-channel MOSFET of claim 67, wherein said gate comprises n+ doped polysilicon.

70. The high-voltage p-channel MOSFET of claim 67, wherein said gate comprises metal.

71. The high-voltage p-channel MOSFET of claim 67, wherein said dielectric material is silicon dioxide.

72. The high-voltage p-channel MOSFET of claim 67, wherein said isolators are formed with an STI process.

73. The high-voltage p-channel MOSFET of claim 67, wherein said isolators are formed with a LOCOS process.

74. The high-voltage p-channel MOSFET of claim 67, wherein:
   the MOSFET is fabricated using a process technology providing an MFS of no greater than 0.18 microns.

75. The high-voltage p-channel MOSFET of claim 74, wherein:
   the isolators are fabricated using STI.

76. The high-voltage p-channel MOSFET of claim 75, wherein:
   a length Lw of a region of lateral diffusion under the gate being greater than or equal to 0.0 microns;

a length Lsub of the graded junction region being greater than or equal to 0.4 microns;

a length Lc of a channel region extending between the first p+ doped region and the first isolator being greater than or equal to 0.7 microns;

a length Ldp of a region coextensive with the first isolator and extending to an edge of the second p+ doped region being greater than or equal to 0.8 microns; and a length Lo of a region extending from one end of the channel to the end of the gate being is greater than or equal to 0.4 microns.

77. The high-voltage p-channel MOSFET of claim 74, wherein:

the isolators are fabricated using LOCOS.

78. The high-voltage p-channel MOSFET of claim 77, wherein:

a length Lw of a region of lateral diffusion under the gate being greater than or equal to 0.2 microns;

a length Lsub of the graded junction region being greater than or equal to 0.4 microns;

a length Lc of a channel region extending between the first p+ doped region and the first isolator being greater than or equal to 0.7 microns;

a length Ldp of a region coextensive with the first isolator and extending to an edge of the second p+ doped region being greater than or equal to 0.8 microns; and a length Lo of a region extending from one end of the channel to the end of the gate being greater than or equal to 0.4 microns.

79. The high-voltage p-channel MOSFET of claim 67, wherein said graded-junction region comprises substrate material.

80. The high-voltage p-channel MOSFET of claim 67, wherein said graded-junction region is achieved by using a n− well blocking layer during fabrication.

* * * * *